United States Patent
Takagi et al.

(10) Patent No.: US 12,295,105 B2
(45) Date of Patent: May 6, 2025

(54) SIMULATION DEVICE AND SIMULATION METHOD

(71) Applicant: FUJI CORPORATION, Chiryu (JP)

(72) Inventors: Shota Takagi, Chiryu (JP); Kohei Ishikawa, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 665 days.

(21) Appl. No.: 17/762,218

(22) PCT Filed: Sep. 27, 2019

(86) PCT No.: PCT/JP2019/038386
§ 371 (c)(1),
(2) Date: Oct. 25, 2022

(87) PCT Pub. No.: WO2021/059535
PCT Pub. Date: Apr. 1, 2021

(65) Prior Publication Data
US 2023/0069611 A1    Mar. 2, 2023

(51) Int. Cl.
*H05K 13/08* (2006.01)
*G06F 30/20* (2020.01)
*H05K 13/02* (2006.01)

(52) U.S. Cl.
CPC .......... *H05K 13/085* (2018.08); *G06F 30/20* (2020.01); *H05K 13/02* (2013.01)

(58) Field of Classification Search
CPC .... H05K 13/085; H05K 13/02; H05K 13/021; H05K 13/086; G06F 30/20; Y02P 90/02
See application file for complete search history.

(56) References Cited

U.S. PATENT DOCUMENTS

| | | | |
|---|---|---|---|
| 6,172,688 B1 * | 1/2001 | Iwasaki | B41J 3/4075 |
| | | | 347/2 |
| 10,285,315 B2 * | 5/2019 | Iisaka | H05K 3/30 |
| 10,361,802 B1 * | 7/2019 | Hoffberg-Borghesani | |
| | | | G06F 3/00 |
| 10,959,360 B2 * | 3/2021 | Kondo | H05K 13/08 |

(Continued)

FOREIGN PATENT DOCUMENTS

| | | |
|---|---|---|
| EP | 3 171 236 B1 | 1/2019 |
| EP | 3 541 162 A1 | 9/2019 |
| WO | WO 2017/033268 A1 | 3/2017 |

OTHER PUBLICATIONS

International Search Report mailed on Dec. 17, 2019 in PCT/JP2019/038386 filed on Sep. 27, 2019, therein, 2 pages.

*Primary Examiner* — Ramesh B Patel
(74) *Attorney, Agent, or Firm* — Oblon, McClelland, Maier & Neustadt, L.L.P.

(57) ABSTRACT

The simulation device includes a simulation section and an output section. The simulation section is configured to simulate an operating status of a board work machine configured to perform predetermined board work on a board and produce a board product, and an operating status of an article moving device configured to supply an article needed for production of the board product to the board work machine based on a production plan of the board product. The output section is configured to output time series information indicating a temporal change of the operating status of the board work machine and a temporal change of the operating status of the article moving device, which are results of simulation by the simulation section.

13 Claims, 6 Drawing Sheets

(56) References Cited

U.S. PATENT DOCUMENTS

| | | | |
|---|---|---|---|
| 11,726,184 B2* | 8/2023 | Ferreira | G01S 7/4815 |
| | | | 356/4.01 |
| 12,063,746 B2* | 8/2024 | Kinoshita | H05K 13/021 |
| 2019/0230832 A1* | 7/2019 | Ohashi | G06Q 10/0875 |
| 2019/0247664 A1* | 8/2019 | Irazoqui | A61B 5/01 |
| 2019/0380239 A1* | 12/2019 | Kobayashi | H05K 13/0409 |
| 2020/0284883 A1* | 9/2020 | Ferreira | G01S 17/10 |
| 2021/0168978 A1* | 6/2021 | Kawai | H05K 13/021 |
| 2022/0374566 A1* | 11/2022 | Ishikawa | H05K 13/02 |
| 2022/0394895 A1* | 12/2022 | Kinoshita | H05K 13/021 |

* cited by examiner

| TIME | SUPPLY INFORMATION OF COMPONENT | MOUNTING INFORMATION OF COMPONENT | SUPPLY INFORMATION OF FEEDER | EXCHANGE INFORMATION OF FEEDER | COLLECTION INFORMATION OF FEEDER |
|---|---|---|---|---|---|
| T11 | D11 | D21 | D31 | D41 | D51 |
| T12 | D12 | D22 | D32 | D42 | D52 |
| : | : | : | : | : | : |

SIMULATION DEVICE AND SIMULATION METHOD

TECHNICAL FIELD

The present description discloses the technology relating to a simulation device and a simulation method.

BACKGROUND ART

A component mounting line disclosed in Patent Literature 1 includes a component mounter, a feeder storage, and an exchanging robot. The component mounter mounts a component supplied from a feeder on a board. The feeder storage stores the feeder detachable from the component mounter. The exchanging robot conveys the feeder, and exchanges the feeder between the feeder storage and the component mounter. As a result, in the component mounting line disclosed in Patent Literature 1, it attempts to automate a supply operation of the feeder for supplying the feeder stored in the feeder storage to the component mounter.

PATENT LITERATURE

Patent Literature 1: International Publication No. WO2017/033268

BRIEF SUMMARY

Technical Problem

In the component mounting line disclosed in Patent Literature 1, the component mounter produces a board product while receiving the supply of the feeder by the exchanging robot. Therefore, it is demanded to grasp a temporal change of the operating status of the component mounter and a temporal change of the operating status of the exchanging robot.

In view of such a circumstance, the present description discloses a simulation device and a simulation method that can output a temporal change of an operating status of a board work machine and a temporal change of an operating status of an article moving device.

Solution to Problem

The present description discloses a simulation device including a simulation section and an output section. The simulation section is configured to simulate an operating status of a board work machine configured to perform predetermined board work on a board and produce a board product, and an operating status of an article moving device configured to supply an article needed for production of the board product to the board work machine based on a production plan of the board product. The output section is configured to output time series information indicating a temporal change of the operating status of the board work machine and a temporal change of the operating status of the article moving device, which are results of simulation by the simulation section.

In addition, the present description discloses a simulation method including a simulation step and an output step. In the simulation step, an operating status of a board work machine configured to perform predetermined board work on a board and produce a board product, and an operating status of an article moving device configured to supply an article needed for production of the board product to the board work machine is simulated based on a production plan of the board product. In the output step, time series information indicating a temporal change of the operating status of the board work machine and a temporal change of the operating status of the article moving device, which are results of simulation in the simulation step, is output.

Advantageous Effects

A simulation device includes a simulation section and an output section. Accordingly, the simulation device can output a temporal change of an operating status of a board work machine and a temporal change of an operating status of an article moving device. It is also possible to similarly apply the above description of the simulation device to the simulation method.

DESCRIPTION OF EMBODIMENTS

1. Embodiment

1-1. Configuration Example of Board Production Line 1

Figure 1:
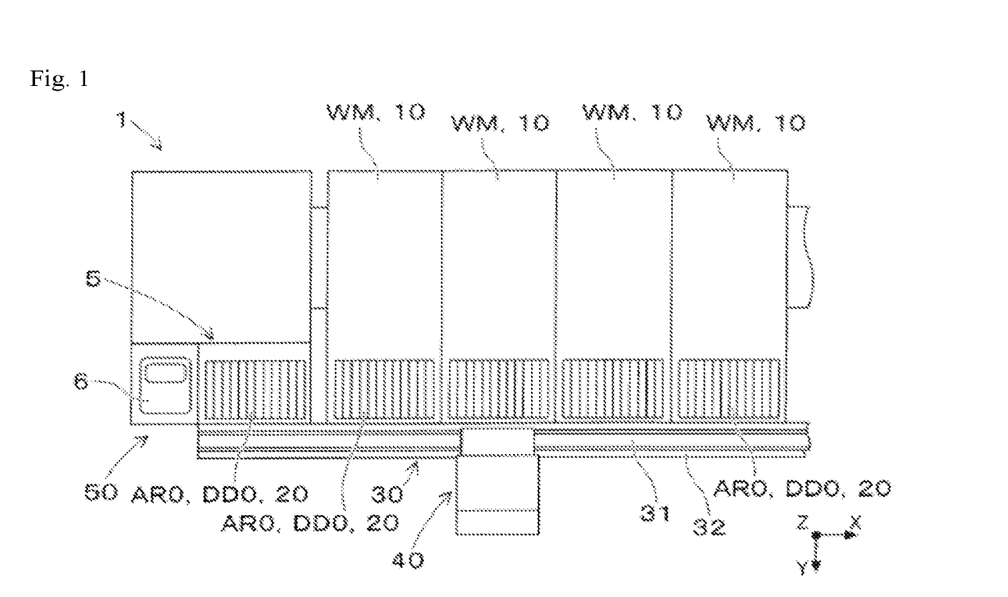
FIG. 1 is a plan view showing a configuration example of a board production line.

As shown in FIG. 1, board production line 1 includes at least one (four in FIG. 1) component mounter 10, exchange system 30, article moving device 40, storage device 5, and line control computer 6. Four component mounters 10 are installed along a conveyance direction of board 90 shown in FIG. 2. Component mounter 10 is included in board work machine WM that performs predetermined board work on board 90. The board work by component mounter 10 includes a carrying-in operation and a carrying-out operation of board 90, a pick-up operation and a mounting operation of a component, and the like. Component mounter 10 is detachably provided with, for example, cassette-type feeder 20.

Storage device 5 used, for example, for storing feeder 20 is installed on a board carrying-in side (on a paper left side of FIG. 1) of board production line 1. In addition, board production line 1 is provided with exchange system 30 and article moving device 40, and performs a replenishment operation, an exchange operation, and a collection operation of feeder 20. It should be noted that a configuration of board production line 1 can be appropriately added or changed depending on, for example, a type of a board product to be produced. Specifically, for example, board work machine WM, such as a solder printing machine, an inspection machine, or a reflow furnace, can be appropriately installed in board production line 1.

Each device constituting board production line 1 is configured to be able to input and output various data to and from line control computer 6 via a network. For example, storage device 5 includes multiple slots. Storage device 5 stores feeder 20 equipped in multiple slots. Feeder 20 equipped in the slot of storage device 5 is placed in a state capable of communicating with line control computer 6. As a result, the slot of storage device 5 and an identification code of feeder 20 equipped in the slot are recorded in line control computer 6 in association with each other.

In addition, line control computer 6 monitors an operation status of board production line 1, and integrally controls board work machine WM, such as component mounter 10, exchange system 30, article moving device 40, and storage device 5. Various data for controlling board work machine WM, exchange system 30, article moving device 40, and storage device 5 are stored in line control computer 6. Line control computer 6 transmits various data, such as a control program, when, for example, component mounter 10 executes a mounting process of the component.

1-2. Configuration Example of Component Mounter 10

Figure 2:
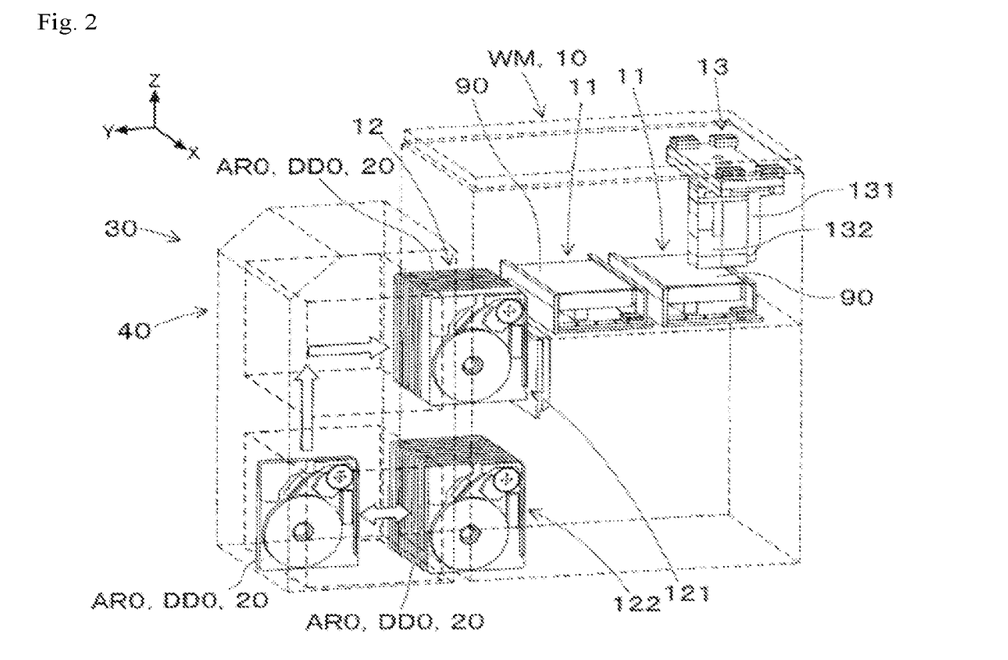
FIG. 2 is a perspective view showing a schematic configuration of an exchange system and a component mounter in FIG. 1.

As shown in FIG. 2, each of four component mounters 10 includes board conveyance device 11, component supply device 12, and head driving device 13. In the following description, it is assumed that a horizontal width direction of component mounter 10, which is the conveyance direction of board 90, is an X-direction, a horizontal depth direction of component mounter 10 is a Y-direction, and a vertical direction (paper up-down direction of FIG. 2) perpendicular to the X-direction and the Y-direction is a Z-direction.

Board conveyance device 11 is configured by, for example, a belt conveyor and a positioning device. Board conveyance device 11 sequentially conveys board 90 in the conveyance direction, and positions board 90 at a predetermined position in the device. Board conveyance device 11 carries board 90 out of component mounter 10 after the mounting process by component mounter 10 is terminated.

Component supply device 12 supplies component to be mounted on board 90. Component supply device 12 includes first slot 121 and second slot 122 that can be equipped with multiple feeders 20. In the present embodiment, first slot 121 is disposed in an upper part of a front side of component mounter 10 to hold equipped feeder 20 in an operable manner. An operation of feeder 20 equipped in first slot 121 is controlled in the mounting process by component mounter 10 to supply the component in an extraction section provided at a defined position on an upper part of feeder 20.

In the present embodiment, second slot 122 is disposed below first slot 121 to store equipped feeder 20. That is, second slot 122 preliminarily holds feeder 20 used for production, or temporarily holds used feeder 20 used for production. It should be noted that the exchange operation of feeder 20 between first slot 121 and second slot 122 is performed by article moving device 40.

In addition, when feeder 20 is equipped in first slot 121 or second slot 122 of component supply device 12, electric power is supplied from component mounter 10 via a connector. Moreover, feeder 20 is placed in a state capable of communicating with component mounter 10. Feeder 20 equipped in first slot 121 controls a feeding operation of a carrier tape accommodating the component based on a control instruction or the like by component mounter 10. As a result, feeder 20 supplies component in the extraction section provided in the upper part of feeder 20 so as to be able to be picked up by a holding member of mounting head 132.

Head driving device 13 moves moving body 131 in the horizontal direction (X-direction and Y-direction) by a linear motion mechanism. Mounting head 132 is fixed to moving body 131 by a clamp member in an exchangeable (detachable) manner. Mounting head 132 is moved in the XY-directions integrally with moving body 131 by the linear motion mechanism of head driving device 13. Mounting head 132 picks the component supplied by component supply device 12 up by the holding member. As the holding member, for example, a suction nozzle that picks the component up by supplied negative pressure air, a chuck that grips the component, or the like can be used.

Mounting head 132 holds the holding member so as to be movable in the Z-direction and to be rotatable around a Q-axis parallel to the Z-axis. Mounting head 132 adjusts a position and an angle of the holding member depending on a posture of the picked up component. Moreover, mounting head 132 mounts the component to a mounting position of board 90 as instructed by the control program. A total time of a time required for a predetermined number of cycles of a pick-and-place cycle of the component and a time required for carrying board 90 in and out is a cycle time per board 90.

It should be noted that the holding member provided in mounting head 132 can be appropriately changed depending on a type of component in the mounting process of mounting the component on board 90. Component mounter 10 attaches the suction nozzle accommodated in a nozzle station to mounting head 132, for example, in a case in which the suction nozzle used in the mounting process to be executed is not attached to mounting head 132. The nozzle station is detachably equipped in a predetermined position in component mounter 10.

1-3. Configuration Example of Feeder 20

Figure 3:
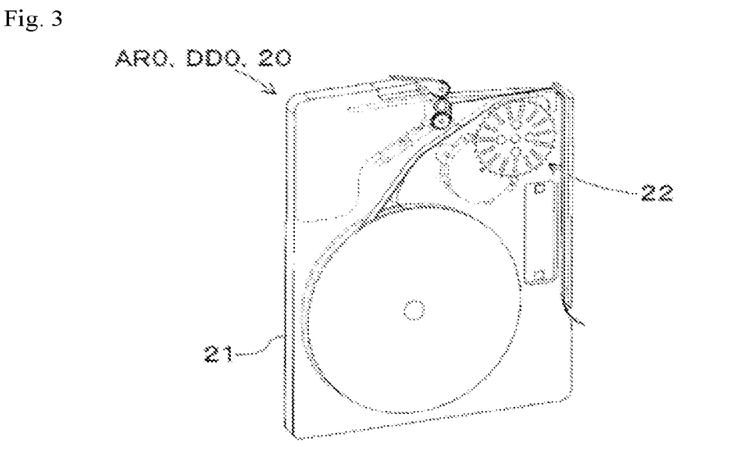
FIG. 3 is a perspective view showing an external appearance of a feeder shown in FIG. 2.

As shown in FIG. 3, feeder 20 includes feeder main body 21 and driving device 22. Feeder main body 21 of the present embodiment is formed in a flat box shape. Feeder main body 21 holds a reel on which the carrier tape accommodating a large number of components is wound in a detachable (exchangeable) manner. Driving device 22 includes a sprocket that engages a feeding hole provided in the carrier tape. Driving device 22 rotates the sprocket to feed and move the carrier tape.

An operation of driving device 22 of feeder 20 is controlled by a control device (not shown). When feeder 20 is equipped in first slot 121 of component mounter 10, feeder 20 receives the electric power supplied from component mounter 10 via the connector. As a result, the control device of feeder 20 is placed in a state capable of communicating with component mounter 10. It is also possible to similarly apply the above description of first slot 121 to second slot 122. As a result, component mounter 10 can detect the replenishment and the collection of feeder 20 in first slot 121 and second slot 122.

1-4. Configuration Examples of Exchange System 30 and Article Moving Device 40

As shown in FIG. 1 and FIG. 2, exchange system 30 includes first rail 31 and second rail 32. First rail 31 and second rail 32 form a traveling path of article moving device 40. First rail 31 is provided along an arrangement direction of four component mounters 10, and is provided between first slot 121 and second slot 122 in the up-down direction (Z-direction). Second rail 32 is provided along the arrangement direction of four component mounters 10, and is provided below second slot 122 in the up-down direction (Z-direction). First rail 31 and second rail 32 extend over substantially the entire area in the conveyance direction of board 90 in board production line 1.

Article moving device 40 is provided so as to be able to travel along the traveling path formed by first rail 31 and second rail 32. Article moving device 40 receives the electric power supplied from a power transmission section by non-contact power supply, for example, via a power receiving section provided to face the power transmission section provided in first rail 31. The electric power received by the power receiving section is used for traveling of article moving device 40, a predetermined operation, or the like via a power receiving circuit. It should be noted that article moving device 40 detects, for example, a position (current position) on the traveling path by a position detection device. As the position detection device, for example, an optical detection method, a detection method using electromagnetic induction, or the like can be applied.

The "predetermined operation" includes an exchange operation for exchanging device DD0 detachably provided in board work machine WM, such as component mounter 10, with board work machine WM. In the present embodiment, article moving device 40 uses feeder 20 that supplies the component to be mounted on board 90 as device DD0, and performs the exchange operation of feeder 20 between component mounter 10, which is board work machine WM, and storage device 5.

In the present embodiment, article moving device 40 conveys feeder 20 from storage device 5 to first slot 121 or second slot 122 of component mounter 10, and performs the replenishment operation of feeder 20. In addition, article moving device 40 performs the exchange operation of feeder 20 between first slot 121 and second slot 122 of component mounter 10. Further, article moving device 40 conveys feeder 20, which is no longer needed, from component mounter 10 to storage device 5, and performs the collection operation of feeder 20.

Figure 4:
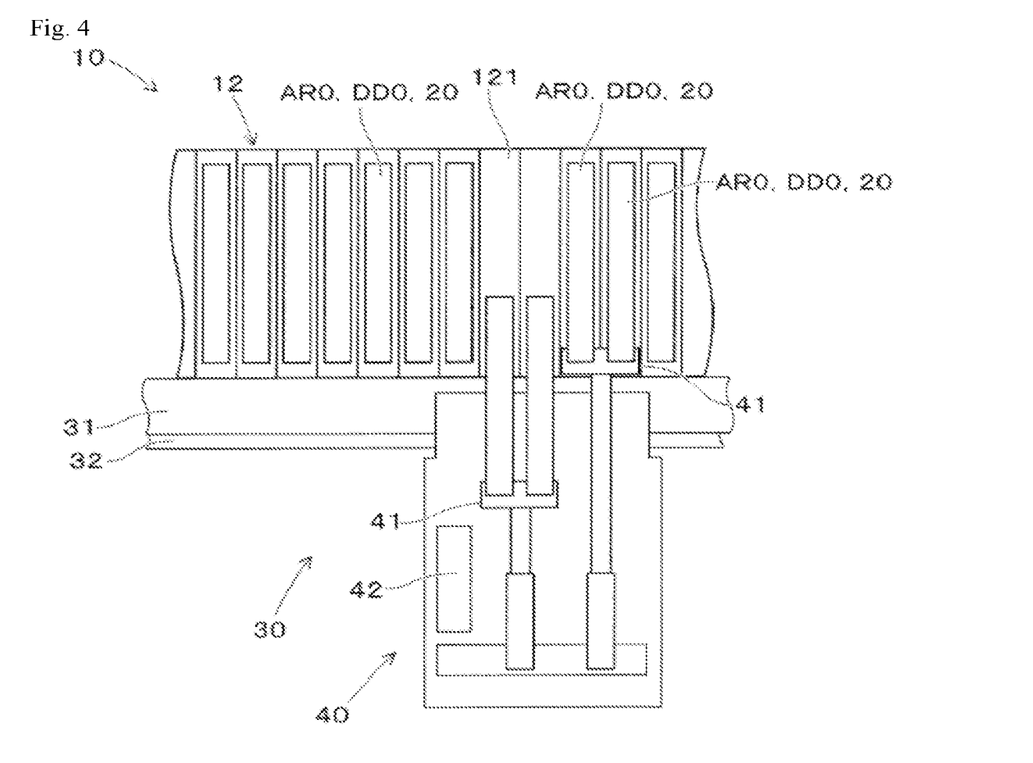
FIG. 4 is a plan view showing an example of an exchange operation of the feeder between an article moving device and a component supply device of the component mounter.

As shown in FIG. 4, article moving device 40 includes at least one (two in FIG. 4) holding section 41 and control device 42. In the present embodiment, each of two holding sections 41 can simultaneously clamp multiple (two in FIG. 4) feeders 20, and can simultaneously hold multiple (two) feeders 20. In addition, each of two holding sections 41 is independently movable along an attachment/detachment direction (Y-direction in the present embodiment) of feeder 20 by, for example, the linear motion mechanism or the like, and can simultaneously move multiple (two) feeders 20 along the Y-direction.

Further, two holding sections 41 are integrally movable in the up-down direction (Z-direction) by, for example, the linear motion mechanism or the like, and can simultaneously move multiple (four) feeders 20 in the Z-direction. It should be noted that article moving device 40 can, for example, multiple (four) holding sections 41. In this case, each of multiple (four) holding sections 41 clamps one feeder 20, so that multiple (four) feeders 20 can be moved independently in the Y-direction and the Z-direction. In addition, a form of holding section 41 is not limited to the clamp mechanism and the linear motion mechanism, and can have various forms. For example, holding section 41 can include a protruding portion that can be fitted into a hole portion provided in feeder 20. In this case, feeder 20 is held by fitting the protruding portion of holding section 41 into the hole portion of feeder 20.

Control device 42 includes a well-known computing device and a memory device, in which a control circuit is configured (all not shown). Control device 42 is connected to four component mounters 10, exchange system 30, storage device 5, and line control computer 6 in a communicable manner. Control device 42 controls the traveling of article moving device 40, the operations of two holding sections 41, and the like. With the configuration described above, article moving device 40 can be moved to a predetermined position along first rail 31 and second rail 32, and can perform the exchange operation of feeder 20 at a stopping position.

1-5. Configuration Example of Simulation Device 50

In board production line 1, component mounter 10 produces the board product while receiving the supply of feeder 20 by article moving device 40. Therefore, it is demanded to grasp the temporal change of the operating status of component mounter 10 and the temporal change of the operating status of article moving device 40. Accordingly, in the present embodiment, simulation device 50 is provided.

Figure 5:
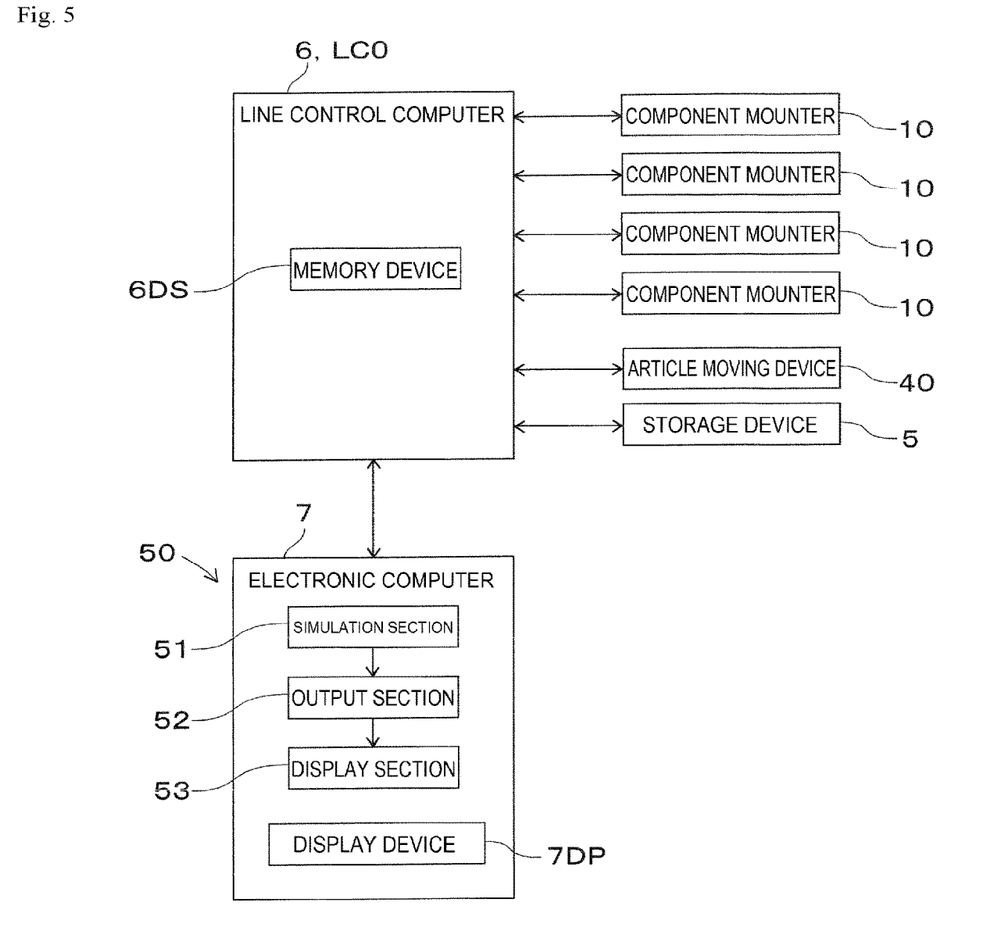
FIG. 5 is a block diagram showing an example of a control block of a simulation device.

Simulation device 50 can be provided in various electronic computers, control devices, and the like. As shown in FIG. 5, simulation device 50 according to the present embodiment is provided in electronic computer 7. Electronic computer 7 includes a well-known computing device, a memory device, an input device, and an output device. Simulation device 50 can be formed, for example, on line control computer 6, a host computer that manages multiple board production lines 1, a cloud, or the like.

In addition, as shown in FIG. 5, simulation device 50 includes simulation section 51 and output section 52 when viewed as control blocks. Simulation device 50 can further include display section 53. In the present embodiment, simulation device 50 includes simulation section 51, output section 52, and display section 53. In addition, simulation device 50 executes computing processing according to the flowchart shown in FIG. 6. Simulation section 51 performs the processing and determination shown in steps S11 to S16. Output section 52 performs the processing shown in step S17. Display section 53 performs the processing shown in step S18.

1-5-1. Simulation Section 51

Figure 6:
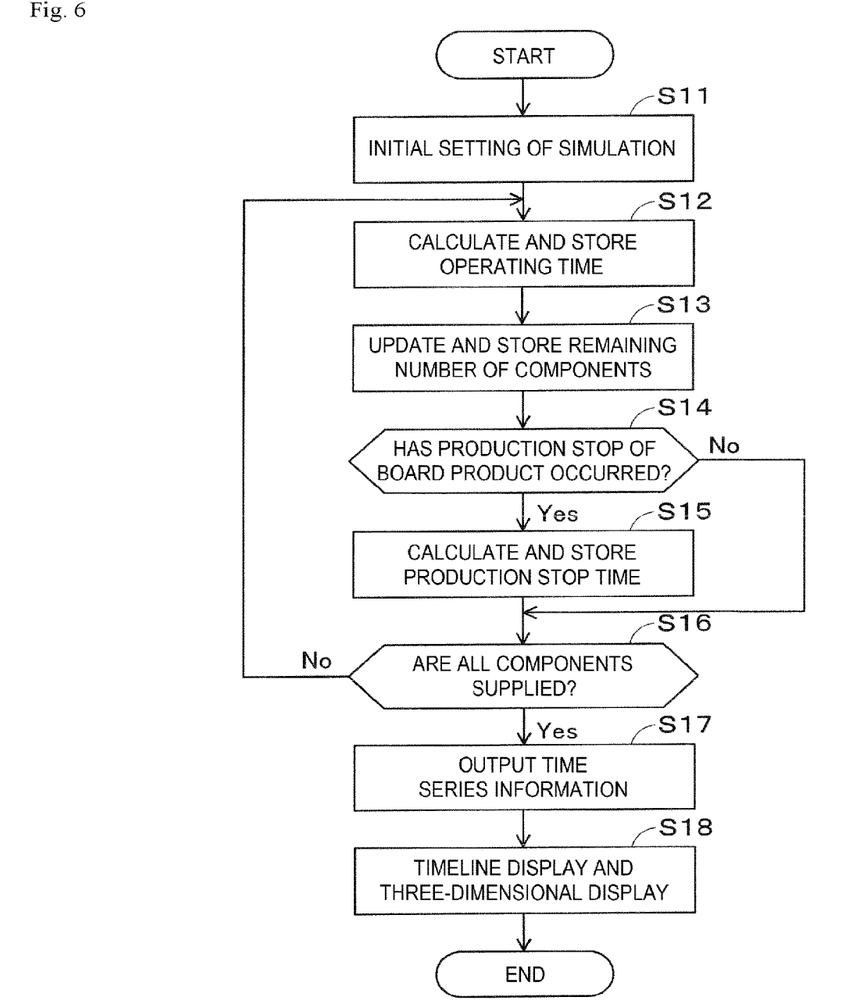
FIG. 6 is a flowchart showing an example of a simulation procedure by the simulation device.

Simulation section 51 simulates an operating status of board work machine WM that performs predetermined board work on board 90 to produce the board product, and an operating status of article moving device 40 that supplies article AR0 needed for the production of the board product to board work machine WM, based on the production plan of the board product (steps S11 to S16 shown in FIG. 6).

As shown in FIG. 1, board production line 1 according to the present embodiment includes board work machine WM including component mounter 10, article moving device 40, and storage device 5. Storage device 5 can store, in addition to feeder 20, article AR0 needed for the production of the board product by board work machine WM. For example, device DD0 detachably provided in board work machine WM is included in article AR0.

In a case in which board work machine WM is component mounter 10, for example, feeder 20, the reel or a component tray that accommodates multiple components, mounting head 132, the holding member (suction nozzle, chuck, or the like), the nozzle station, and the like are included in device DD0. In a case in which board work machine WM is a solder printing machine that prints solder on board 90, for example, a solder cup, a mask, a squeegee, a dispense head, and the like are included in device DD0. In a case in which board work machine WM is an inspection machine, for example, an inspection head and the like are included in device DD0.

The inspection machine includes a solder inspection machine that inspects solder printed on board 90, an appearance inspection machine that inspects a component mounted on board 90, and the like.

Similarly, article moving device 40 can supply, in addition to feeder 20, article AR0 stored in storage device 5 to board work machine WM, and collect article AR0, which is no longer needed in board work machine WM, in storage device 5. In addition, in the present embodiment, component mounter 10 that is board work machine WM includes first slot 121 and second slot 122. Another board work machine WM can also include first slot 121 and second slot 122, and article AR0 to be held is not limited to feeder 20.

That is, board work machine WM can include first slot 121 that holds article AR0 needed for the production of the board product in an exchangeable manner, and second slot 122 that can preliminarily hold article AR0 or can temporarily hold article AR0 to be collected. Article moving device 40 can perform the exchange operation of article AR0 between first slot 121 and second slot 122.

In addition, as shown in FIG. 5, line control computer 6 includes memory device 6DS. As memory device 6DS, for example, a magnetic memory device such as a hard disk device, a memory device using a semiconductor element, such as a flash memory, or the like can be used. Memory device 6DS stores a production plan of the board product.

Simulation section 51 can acquire the production plan from management device LC0 that manages the production plan, and can perform the simulation based on the acquired production plan. In the present embodiment, line control computer 6 corresponds to management device LC0. As a result, simulation section 51 can easily set the production plan included in a simulation condition.

In addition, simulation section 51 can also cause an operator to input the production plan, and perform the simulation based on the production plan input by the operator. In this case, the operator can individually set the production plan included in the simulation condition, and also can easily change the simulation condition. It should be noted that simulation section 51 may acquire the production plan from management device LC0, cause the operator to change a part of the acquired production plan, and may set the simulation condition including the production plan.

In any case, the production plan of the board product includes at least a type and a production scheduled number of the board products, and a type and a needed number of articles AR0. Board work machine WM produces the board product while receiving the supply of article AR0 by article moving device 40. Accordingly, in order for simulation section 51 to simulate the operating status of board work machine WM and the operating status of article moving device 40, at least information described above is needed as the simulation condition.

In addition, for example, board production line 1 shown in FIG. 1 includes four component mounters 10. Since board 90 is sequentially conveyed to four component mounters 10, the production time of the board product by component mounter 10 is affected by component mounter 10 having the longest production time among four component mounters 10. Similarly, the production time of the board product is affected by a solder printing machine, a solder inspection machine, or the like on the upstream side. In addition, the production time of the board product is affected by a reflow furnace, an appearance inspection machine, or the like on the downstream side. Accordingly, the simulation condition may include the production required time of board work machine WM that becomes a bottleneck. For example, in a case in which board work machine WM is component mounter 10, the production required time can be represented by using a cycle time.

Further, for example, production stop time of component mounter 10 occurring by the changeover differs between a case in which the changeover is started after the production of all four component mounters 10 is stopped and a case in which the changeover is started from component mounter 10 on which the changeover is enabled. Accordingly, the simulation condition may include a method of changeover of board work machine WM. It should be noted that the changeover is performed, for example, when the production plan of the board product is switched, a configuration of each device of board work machine WM (including article AR0) is changed as needed, and a control program for driving and controlling board work machine WM is changed as needed.

In addition, for example, there is a case in which the notice of the supply of article AR0 is given before article AR0 is needed for the production of the board product, and article AR0 can be preliminarily held in second slot 122 of board work machine WM. In this case, there is a possibility that the type and the number of article AR0 that can be prepared in second slot 122 in advance are changed and the operating status of board work machine WM and the operating status of article moving device 40 are changed due to a time difference between the scheduled time during which article AR0 is needed for the production of the board product and the notice time during which the notice of the supply of article AR0 is given. Accordingly, the simulation condition may include the notice time during which the notice of the supply of article AR0 is given.

It is also possible to similarly apply the above description to the shortage of the supply supplied from article AR0. For example, in a case in which article AR0 is feeder 20, a component accommodated in a carrier tape wound on a reel corresponds to the supply. In this case, the simulation condition may include the notice time during which the notice of the shortage of the component supplied from feeder 20 is given. It is also possible to similarly apply the above description to a case in which article AR0 is a component tray, a nozzle station, a solder cup, or the like, for example.

In addition, the scheduled time needed for the production of the board product by article AR0 to be supplied is changed depending on an initial value of the remaining number of the supplies supplied from article AR0. Accordingly, the simulation condition may include the initial value of the remaining number of the supplies supplied from article AR0. It should be noted that in a case in which article AR0 is feeder 20 and the supply is the component, the initial value of the remaining number of the supplies can be set, for example, for each tape width of the carrier tape. As the tape width is increased, the size of the accommodated component is increased, so that the number of accommodated components tends to be decreased.

In addition, for example, there is a possibility that an order of use, the frequency of use, and the like of device DD are changed depending on the initial disposition of device DD0 detachably provided in board work machine WM in first slot 121 and second slot 122. Accordingly, the simulation condition may include the initial disposition of device DD0 detachably provided in board work machine WM in first slot 121 and second slot 122. By including at least one of the matters described above in the simulation condition, simulation section S1 can perform the simulation close to the actual operating status of board work machine WM and the operating status of article moving device 40.

Simulation section 51 simulates the operating status of board work machine WM and the operating status of article moving device 40 based on the simulation condition including the production plan of the board product. First, simulation section 51 performs initial setting of the simulation (step S11 shown in FIG. 6). The initial setting includes the setting of the simulation condition described above, the supply plan of article AR0 and the supply plan of the supplies supplied from article AR0, the creation of the collection plan of article AR0, which is no longer needed, and the like.

In the present embodiment, simulation section 51 creates the supply plan of feeder 20 that is article AR0, the supply plan of the component supplied from feeder 20, and the collection plan of feeder 20, which is no longer needed. The supply plan of the component includes feeder 20 that supplies the component, a holding member that picks the component up, a mounting position on board 90 on which the component is mounted, an order of supplying the component (order of mounting the component on board 90), the supply number of the component, and the like. The supply plan of the component is optimized such that the cycle time is optimized based on the production plan of the board product. A method of optimization is not limited, and a well-known method can be used.

The supply plan or the collection plan of feeder 20 includes component mounter 10 that performs the supply or the collection, a position in first slot 121 or second slot 122, the timing and the order of supplying or collecting feeder 20, the number of feeders 20, and the like. The supply plan or the collection plan of feeder 20 is optimized such that, for example, the number of feeders 20 to be supplied or collected at once, the movement amount of article moving device 40, the number of movements, and the like are optimized. A method of optimization is not limited, and a well-known method can be used.

Next, simulation section 51 sequentially executes the supply plan of article AR0, the supply plan of the supply, and the collection plan of article AR0, and stores the execution time needed to execute these plans in the memory device of electronic computer 7 (step S12). In the present embodiment, simulation section 51 calculates the required time (operating time of component mounter 10) each time the component is supplied by component mounter 10 and the component is mounted on board 90, and stores the calculated required time in the memory device. In the present description, the time zone in which board work machine WM is operated is referred to as first operating time zone TD1.

Simulation section 51 calculates the required time (operating time of article moving device 40) each time the supply operation, the exchange operation, the collection operation, or the like of feeder 20 is performed, and stores the calculated required time in the memory device. Similarly, simulation section 51 calculates the time during which article moving device 40 is stopped (time during which article moving device 40 waits without performing the operation described above), and stores the calculated time in the memory device. In the present description, the time zone in which article moving device 40 is operated is referred to as second operating time zone TD2. The time zone in which article moving device 40 is stopped is referred to as second stop time zone TN2.

In addition, simulation section 51 calculates the remaining number of the supplies supplied from article AR0, and stores the remaining number of supplies in the memory device (step S13). In the present embodiment, each time the component is supplied from feeder 20, the remaining number of the components is reduced and stored in the memory device. When the remaining number of the components is zero, the shortage of the component to be supplied occurs.

Further, simulation section 51 determines whether a production stop of the board product has occurred (step S14). In the present embodiment, simulation section 51 can determine that the production stop of the board product by component mounter 10 has occurred in a case in which feeder 20 needed for the production of the board product is not equipped in first slot 121 (occurrence of the changeover). In addition, simulation section 51 can determine that the production stop of the board product by component mounter 10 has occurred in a case in which the remaining number of the components supplied from feeder 20 equipped in first slot 121 is zero (shortage of the component or shortage of feeder 20).

When the production stop of the board product has occurred (Yes in step S4), simulation section 51 calculates the production stop time of board work machine WM, and stores the production stop time in the memory device (step S15). In the present description, the time zone in which board work machine WM is stopped (time zone in which board work machine WM waits without performing the board work) is referred to as first stop time zone TN1. In a case in which the production of the board product continues (No in step S14), simulation section 51 does not execute the processing shown in step S15. Next, simulation section 51 determines whether all the supplies (components) included in the supply plan have been supplied (step S16).

In a case in which all the supplies (components) included in the supply plan are supplied (Yes in step S16), output section 52 outputs time series information indicating the temporal change of the operating status of board work machine WM (component mounter 10) and the temporal change of the operating status of article moving device 40 (step S17). In addition, display section 53 causes display device 7DP to display the temporal change of the operating status of board work machine WM (component mounter 10) and the temporal change of the operating status of article moving device 40 in a timeline and three-dimensionally (step S18).

In a case in which all the supplies (components) included in the supply plan have not been supplied (No in step S16), the control returns to the processing shown in step S12, and the processing and determination shown in steps S12 to S16 are repeated until all the supplies (components) included in the supply plan are supplied. In addition, in the simulation, simulation section 51 acquires the temporal change of the operating status of board work machine WM and the temporal change of the operating status of article moving device 40.

1-5-2. Output Section 52

Output section 52 outputs the time series information indicating the temporal change of the operating status of board work machine WM and the temporal change of the operating status of article moving device 40, which are results of simulation by simulation section 51 (step S17 shown in FIG. 6).

Output section 52 can output various time series information based on the results of simulation by simulation section 51. For example, in a case in which board work machine WM is component mounter 10, output section 52 can output the time series information indicating the temporal change of the operating status of each device of board conveyance device 11, component supply device 12, and head driving device 13 shown in FIG. 2 (including device DD0 detachably provided in component mounter 10).

For example, the operation and the state of component supply device 12 when a predetermined component (supply) is supplied from predetermined feeder 20 equipped at a predetermined position in first slot 121 of component supply device 12, as well as the change thereof, are included in the temporal change of the operating status of component mounter 10. The operation and state of head driving device 13 when the component is picked up and held by a predetermined holding member of predetermined mounting head 132 and the component is mounted on a predetermined mounting position of board 90, as well as the change thereof, are included in the temporal change of the operating status of component mounter 10.

Similarly, output section 52 can output the time series information indicating the temporal change of the operating status of article moving device 40. For example, the operation and state of article moving device 40 when predetermined feeder 20 equipped at a predetermined position in a slot of storage device 5 is conveyed to predetermined component mounter 10 and carried into a predetermined position in a predetermined slot of component mounter 10, as well as the change thereof, are included in the temporal change of the operating status of article moving device 40. As described above, the slot of component mounter 10 includes first slot 121 and second slot 122.

In addition, the operation and state of article moving device 40 when feeder 20 equipped in first slot 121 and feeder 20 equipped in second slot 122 are exchanged with each other, as well as the change thereof, are included in the temporal change of the operating status of article moving device 40. Further, the operation and state of article moving device 40 when feeder 20, which is no longer needed in component mounter 10, is collected from component mounter 10 to storage device 5, as well as the change thereof, are included in the temporal change of the operating status of article moving device 40. In any case, the temporal change of the operating status of article moving device 40 includes the operation and the state of holding section 41 when holding section 41 shown in FIG. 4 carries feeder 20 in or out, as well as the change thereof.

Figure 7:
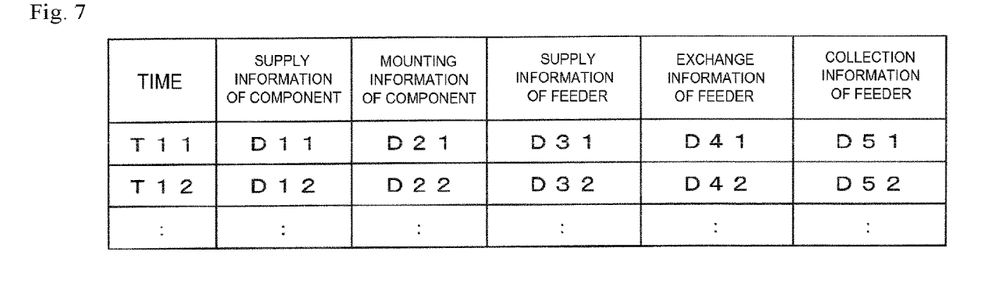
FIG. 7 is a schematic view showing an example of a result of output by an output section.

FIG. 7 shows an example of a result of output by output section 52. FIG. 7 schematically shows supply information and mounting information of the component for each predetermined time (for example, step time of simulation), as well as supply information, exchange information, and collection information of feeder 20. The supply information of the component is a set of the time series information indicating the temporal change of each operation and each state of component supply device 12. The mounting information of the component is a set of the time series information indicating the temporal change of each operation and each state of head driving device 13. The supply information, the exchange information, and the collection information of feeder 20 are a set of the time series information indicating the temporal change of each operation and each state of article moving device 40 including the operation and the state of holding section 41.

Specifically, at time T11, the supply information of the component is indicated by information D11, and the mounting information of the component is indicated by information D21. In addition, at time T11, the supply information of feeder 20 is indicated by information D31, the exchange information is indicated by information D41, and the collection information is indicated by information D51. Similarly, at time T12, the supply information of the component is indicated by information D12, and the mounting information of the component is indicated by information D22. In addition, at time T12, the supply information of feeder 20 is indicated by information D32, the exchange information is indicated by information D42, and the collection information is indicated by information D52.

The time series information output by output section 52 can be used in various methods. For example, the time series information output by output section 52 can be graphed by well-known spreadsheet software or the like. As a result, a user of simulation device 50 can easily compare the temporal change of the operating status of desired board work machine WM with the temporal change of the operating status of desired article moving device 40.

1-5-3. Display Section 53

Based on the time series information output by output section 52, display section 53 causes display device 7DP to display first operating time zone TD1 and first stop time zone TN1 with second operating time zone TD2 and second stop time zone TN2 in a timeline in a comparative manner (step S18 shown in FIG. 6).

Figure 8:
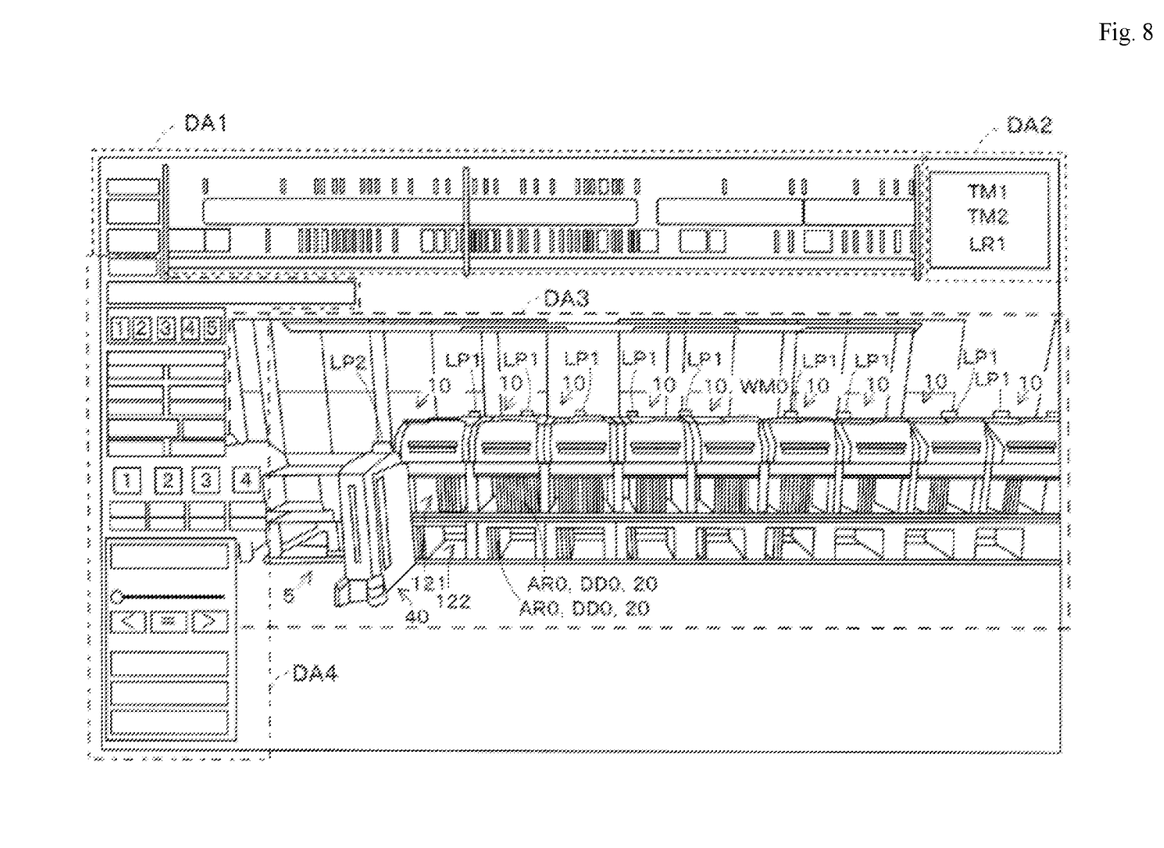
FIG. 8 is a schematic view showing an example of a result of display by a display section.

FIG. 8 shows an example of a result of display by display section 53. First display region DA1 indicates a region in which display device 7DP displays the temporal change of the operating status of board work machine WM (component mounter 10) and the temporal change of the operating status of article moving device 40 in a timeline. Second display region DA2 indicates a region in which display device 7DP displays an operating ratio or the like of article moving device 40. Third display region DA3 shows a region in which display device 7DP three-dimensionally displays the temporal change of the operating status of board work machine WM (component mounter 10) and the temporal change of the operating status of article moving device 40. Fourth display region DA4 shows a region in which display device 7DP displays the operation state or the like of article moving device 40.

Figure 9:
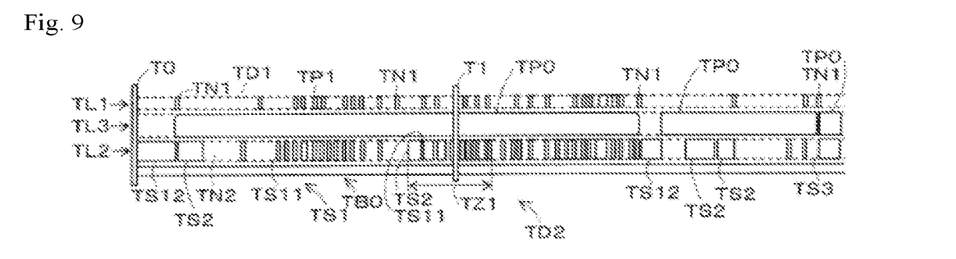
FIG. 9 is a schematic view showing a display example of a first display region.

FIG. 9 shows a display example of first display region DA1. First display region DA1 includes upper stage region TL1 indicating the temporal change of the operating status of board work machine WM (component mounter 10), lower stage region TL2 indicating the temporal change of the operating status of article moving device 40, and middle stage region TL3 indicating production time zone TP0. In addition, in first display region DA1, timeline bar TB0 is moved depending on the time elapse from reference time T of the simulation. In FIG. 9, timeline bar TB0 indicates time T1, whereas the states at time T1 are shown in second display region DA2 to fourth display region DA4 shown in FIG. 8.

In upper stage region TL1, first operating time zone TD1 and first stop time zone TN1 are displayed to be distinguishable from each other. In FIG. 9, first operating time zone TD1 is indicated by the same color as the drawing, and first operating time zone TD1 is indicated by a broken line for convenience of illustration. Display device 7DP can display, for example, first operating time zone TD1 in a transparent manner. First stop time zone TN1 is displayed in a different color from first operating time zone TD1. Display device 7DP can display, for example, first stop time zone TN1 in red.

In addition, in the present description, a time zone in first operating time zone TD1, in which the scheduled production plan is changed due to the shortage of article AR0 in board work machine WM, and board work machine WM performs the board work based on the changed production plan is referred to as recovery production time zone TP1. As described above, the production plan is managed by management device LC0. For example, when a part of article AR0 needed in board work machine WM (component mounter 10) is insufficient, board work machine WM cannot execute the board work based on the scheduled production plan. However, board work machine WM may be capable of performing a preceding operation of performing the board work by using only existing article AR0. In this case, management device LC0 can change the production plan such that board work machine WM executes the preceding operation. The time zone in which board work machine WM performs the preceding operation is included in recovery production time zone TP1.

In addition, when the shortage of article AR0 is supplied to board work machine WM, board work machine WM can perform a subsequent operation of performing the board work by using supplied article AR0. In this case, management device LC0 can change the production plan such that board work machine WM executes the subsequent operation after the preceding operation is completed or together with the preceding operation. The time zone in which board work machine WM performs the subsequent operation is included in recovery production time zone TP1. It should be noted that the subsequent operation can be performed in board work machine WM in which the shortage of article AR0 has occurred, or can be performed in board work machine WM at a later stage (on the downstream side) from board work machine WM.

Since there is possibility that the production plan changed in this manner causes a decrease in the production efficiency as compared with the scheduled production plan, it is preferable that recovery production time zone TP1 can be distinguished from other operating time zones of board work machine WM. Accordingly, display section 53 of the present embodiment displays recovery production time zone TP1 to be distinguishable from other operating time zones of board work machine WM. It should be noted that display section 53 can display only the time zone, in recovery production time zone TP1, in which board work machine WM performs the preceding operation to be distinguishable from other operating time zones of board work machine WM.

Recovery production time zone TP1 is displayed in a different color from first operating time zone TD1 excluding recovery production time zone TP1. Display device 7DP can display, for example, recovery production time zone TP1 in yellow. As a result, the user of simulation device 50 can visually recognize a relationship between recovery production time zone TP1 and the operating status of article moving device 40. It should be noted that, in FIG. 9, for convenience of illustration, recovery production time zone TP1 is denoted by a symbol for a part of the time zone. In upper stage region TL1, a time zone which is not denoted by a symbol indicated by a solid-line square indicates recovery production time zone TP1.

In lower stage region TL2, second operating time zone TD2 and second stop time zone TN2 are displayed to be distinguishable from each other. In FIG. 9, second stop time zone TN2 is shown in the same color as the drawing, and second stop time zone TN2 is shown by a broken line for convenience of illustration. Display device 7DP can display, for example, second stop time zone TN2 in a transparent manner. Second operating time zone TD2 is displayed in a different color from second stop time zone TN2.

Display section 53 can display first supply time zone TS1 to be distinguishable from other operating time zones of article moving device 40. First supply time zone TS1 refers to a time zone, in second operating time zone TD2, in which article moving device 40 is operated to supply article AR0, which is needed due to the shortage of article AR0 or the changeover in board work machine WM (component mounter 10).

In FIG. 9, in first supply time zone TS1, replenishment time zone TS11 and changeover time zone TS12 are displayed to be distinguishable from each other. Replenishment time zone TS11 refers to a time zone, in second operating time zone TD2, in which article moving device 40 is operated to supply article AR0, which is needed due to the shortage of article AR0 in board work machine WM. Changeover time zone TS12 refers to a time zone, in second operating time zone TD2, in which article moving device 40 is operated to supply article AR0, which is needed due to the changeover in board work machine WM.

Display device 7DP can display, for example, replenishment time zone TS11 in yellow, and display changeover time zone TS12 in red. It should be noted that, in FIG. 9, for convenience of illustration, replenishment time zone TS11 is denoted by a symbol for a part of the time zone. In lower stage region TL2, a time zone which is not denoted by a symbol indicated by a solid-line square indicates replenishment time zone TS11 except time zone TZ1. In time zone TZ1, second supply time zone TS2 and replenishment time zone TS11, which will be described below, are alternately repeated.

As a result, the user of simulation device 50 can visually recognize a relationship between first supply time zone TS1 and the operating status of board work machine WM (component mounter 10). For example, the user of simulation device 50 can recognize that recovery production time zone TP1 often occurs immediately after replenishment time zone TS11. In addition, the user of simulation device 50 can recognize that first stop time zone TN1 in which board work machine WM (component mounter 10) is stopped has occurred immediately before or immediately after changeover time zone TS12. It should be noted that when the notice of the supply of article AR0 is given before article AR0 is needed for the production of the board product, display section 53 can display a time zone, in second operating time zone TD2, in which article moving device 4) is operated to supply article AR0 to be distinguishable from other operating time zones.

Display section 53 can display second supply time zone TS2 to be distinguishable from other operating time zones of article moving device 40. Second supply time zone TS2 refers to a time zone, in second operating time zone TD2, in which article moving device 40 is operated to preliminarily supply article AR0 to board work machine WM. Display device 7DP can display, for example, second supply time zone TS2 in blue.

As a result, the user of simulation device 50 can visually recognize a relationship between second supply time zone TS2 and the operating status of board work machine WM (component mounter 10). It should be noted that display section 53 can also display a time zone in which article moving device 40 is operated to preliminarily supply article AR0 to be used in the next production plan, and a time zone in which article moving device 40 is operated to preliminarily supply article AR0 to be used in a subsequent production plan to be distinguishable from each other.

Display section 53 can display collection time zone TS3 to be distinguishable from other operating time zones of article moving device 40. Collection time zone TS3 refers to a time zone, in second operating time zone TD2, in which article moving device 40 is operated to collect article AR0, which is no longer needed in board work machine WM. It should be noted that collection time zone TS3 does not include a time zone in which both the supply and the collection of article AR0 are performed. Display device 7DP can display, for example, collection time zone TS3 in gray. As a result, the user of simulation device 50 can visually recognize a relationship between collection time zone TS3 and the operating status of board work machine WM (component mounter 10).

In the present embodiment, display section 53 causes display device 7DP to display first operating time zone TD1 and first stop time zone TN1, and second operating time zone TD2 and second stop time zone TN2 in a timeline in a comparative manner, based on the time series information output by output section 52. As a result, the user of simulation device 50 can visually recognize a relationship between the temporal change of the operating status of board work machine WM (first operating time zone TD1 and first stop time zone TN1) and the temporal change of the operating status of article moving device 40 (second operating time zone TD2 and second stop time zone TN2).

For example, as the number of times that first stop time zone TN1 in which board work machine WM (component mounter 10) is stopped occurs is larger and second operating time zone TD2 in which article moving device 40 is operated is longer (operating ratio of article moving device 40 is higher), the possibility that the supply lash of article AR0 by article moving device 40 has occurred is higher. In addition, as the number of times that first stop time zone TN1 in which board work machine WM (component mounter 10) is stopped occurs is larger and second operating time zone TD2 in which article moving device 40 is operated is shorter (operating ratio of article moving device 40 is lower), the possibility that the state in which article moving device 40 cannot supply article AR0 has occurred is higher.

The replenishment of article AR0 to storage device 5 is performed by a worker or an unmanned conveyance vehicle (automatic guided vehicle). In addition, article AR0 used in the production plan at the present time (time T1 shown in FIG. 9) has a higher priority of supply than article AR0 used in the subsequent production plan. Accordingly, as the state in which article moving device 40 cannot supply article AR0, for example, a case in which article AR0 needed for board work machine WM is not stored in storage device 5, a case in which the priority of supply is low and article AR0 cannot be supplied to second slot 122 in advance for the convenience of the production plan are assumed. As described above, the user of simulation device 50 can easily compare the temporal change of the operating status of board work machine WM with the temporal change of the operating status of article moving device 40, and can analyze the problems relating to the supply and the collection of article AR0 by article moving device 40.

In addition, display section 53 can display production time zone TP0 from the start of production to the termination of production of the board product in a timeline for each production plan. For example, in middle stage region TL3 shown in FIG. 9, production time zone TP0 is displayed for each production plan. Display device 7DP can display, for example, production time zone TP0 in blue. As a result, the user of simulation device 50 can visually recognize a relationship among the temporal change of the operating status of board work machine WM (first operating time zone TD1 and first stop time zone TN1), the temporal change of the operating status of article moving device 40 (second operating time zone TD2 and second stop time zone TN2), and production time zone TP0.

For example, the user of simulation device 50 can recognize that changeover time zone TS12 often occurs in a time zone between production time zone TP0 according to one production plan and production time zone TP0 according to the next production plan. In addition, the user of simulation device 50 can recognize that collection time zone TS3 has occurred in a case in which changeover time zone TS12 does not occur in the time zone described above.

It should be noted that display device 7DP can display the operating ratio or the like of article moving device 40 in second display region DA2 shown in FIG. 8. Display section 53 can cause display device 7DP to display time TM1, time TM2, and operating ratio LR1 based on the results of simulation by simulation section S1. Time TM1 represents the entire time (integration time) of the simulation. Time TM2 represents an operating time of article moving device 40 (integration time of second operating time zone TD2). Operating ratio LR1 represents the operating ratio of article moving device 40, and is calculated by dividing time TM2 by time TM1.

In addition, display section 53 displays board production line 1 in which board work machine WM and article moving device 40 are provided in a virtual space by a simulation, and sterically display the temporal change of the operating status of board work machine WM and the temporal change of the operating status of article moving device 40 depending on the time elapse of the timeline (step S18 shown in FIG. 6). For example, display device 7DP can display the temporal changes in third display region DA3 shown in FIG. 8.

In FIG. 8, the operating status of board work machine WM (component mounter 10) and the operating status of article moving device 40 at time T1 (see FIG. 9) indicated by timeline bar TB0 are sterically displayed (three-dimensionally displayed). Depending on the time elapse of the timeline, the operating status of board work machine WM (component mounter 10) is temporally changed, and the operating status of article moving device 40 is temporally changed. As a result, the user of simulation device 50 can recognize the operation of board work machine WM (component mounter 10) and the operation of article moving device 40 by a simulation. It should be noted that although board production line 1 shown in FIG. 1 includes four board work machines WM (component mounters 10), nine board work machines WM (component mounters 10) are shown in FIG. 8.

Display section 53 can display recovery production machine WM0, board work machine WM that performs the board work based on the scheduled production plan, and board work machine WM that is stopped without performing the board work to be distinguishable. Similar to recovery production time zone TP1 described above, recovery production machine WM0 refers to board work machine WM that performs the board work, after the scheduled production plan is changed due to the shortage of article AR0 in board work machine WM, based on the changed production plan.

Display section 53 can, for example, display lamp LP1 indicating the operating status of board work machine WM by the simulation (component mounter 10). Display lamp LP1 simulates a display lamp provided in board work machine WM, and the light emitting color thereof is changed depending on the operating status of board work machine WM (component mounter 10). Display device 7DP can display, for example, board work machine WM (component mounter 10) that performs the board work based on the scheduled production plan by green display lamp LP1. Display device 7DP can display, for example, recovery production machine WM0 (component mounter 10) by yellow display lamp LP1. Display device 7DP can display, for example, board work machine WM (component mounter 10) that is stopped without performing the board work by red display lamp LP1. It should be noted that display section 53 can also display lamp LP2 indicating the operating status of article moving device 40 by the simulation.

Display section 53 can sterically display the supply operation of supplying and conveying article AR0 stored in storage device 5 to board work machine WM to which article is to be supplied by article moving device 40, the collection operation of conveying and collecting article AR0, which is no longer needed in board work machine WM, to storage device 5 by article moving device 40. Specifically, in a case in which display section 53 causes display device 7DP to display the supply operation, article moving device 40 shown in FIG. 8 is moved from storage device 5 toward board work machine WM (component mounter 10) to which article AR0 is to be supplied. In a case in which display section 53 causes display device 7DP to display the collection operation, article moving device 40 is moved from board work machine WM (component mounter 10) toward storage device 5. As a result, the user of simulation device 50 can visually recognize the supply operation and the collection operation of article moving device 40 by a simulation.

In addition, in the present embodiment, board work machine WM includes first slot 121 that holds article AR0 used for the production of the board product in an exchangeable manner, and second slot 122 that can preliminarily hold article AR0 or can temporarily hold article AR0 to be collected. In addition, article moving device 40 performs the exchange operation of article AR0 between first slot 121 and second slot 122. In this form, display section 53 can sterically display an occupation region of article AR0 in first slot 121 and an occupation region of article AR0 in second slot 122.

For example, in a case in which article AR0 is feeder 20, as shown in FIG. 8, display section 53 can sterically display the occupation region of article AR0 in first slot 121 and the occupation region of article AR0 in second slot 122 by rectangular parallelepiped simulating feeder 20. In this case, the region occupied by the rectangular parallelepiped in first slot 121 corresponds to the occupation region of feeder 20 in first slot 121. In second slot 122, the region occupied by the rectangular parallelepiped corresponds to the occupation region of feeder 20 in second slot 122. As a result, the user of simulation device 50 can visually recognize an occupation state or an empty state of article AR0 (feeder 20) in first slot 121 and second slot 122.

In addition, display section 53 can change the display color depending on equipped article AR0 (in this case, feeder 20). Display device 7DP can display, for example, feeder 20, which is initially disposed, in green. Display device 7DP can display, for example, feeder 20, which is needed due to the shortage of feeder 20 (component supplied from feeder 20), in yellow. Display device 7DP can display, for example, feeder 20, which is needed due to the changeover, in red. Display device 7DP can display, for example, feeder 20 to be used in the next production plan in blue. The display colors described above coincide with the display colors in the timeline display. It should be noted that display device 7DP can also display feeder 20 used for the production plan at the present time (time T1 shown in FIG. 9) and feeder 20 used for the production plan subsequent to the next production plan to be distinguishable.

Figure 10:
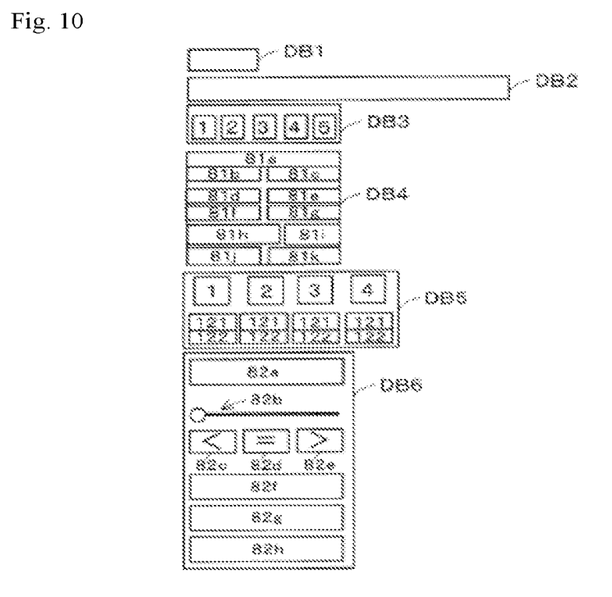
FIG. 10 is a schematic view showing a display example of a fourth display region.

FIG. 10 shows a display example of fourth display region DA4. Based on the time series information output by output section 52, display section 53 can cause display device 7DP to display production plan information DB1, operation state information DB2 of article moving device 40, camera information DB3, operation content information DB4 of article moving device 40, use state information DB5 and setting information DB6 of holding section 41, and the like.

Production plan information DB1 includes information regarding the production plan. The production plan is identified by an identification number. Display device 7DP can display, for example, the identification number of the production plan at the present time (time T1 shown in FIG. 9) of the simulation and the total number of the production plans as production plan information DB1. Operation state information DB2 of article moving device 40 includes text information regarding the operation state of article moving device 40. Display device 7DP can display, for example, the step number of the present time (time T1 shown in FIG. 9) of the simulation, the total number of steps, and the operation state (text information) of article moving device 40 as operation state information DB2.

Camera information DB3 includes, in third display region DA3 shown in FIG. 8, information regarding a line-of-sight direction when display device 7DP sterically displays the temporal change of the operating status of board work machine WM and the temporal change of the operating status of article moving device 40. In the present embodiment, the line-of-sight direction includes five directions. Display device 7DP sterically displays the temporal change of the operating status of board work machine WM and the temporal change of the operating status of article moving device 40 from the line-of-sight direction specified by the designated number.

Operation content information DB4 of article moving device 40 includes information regarding the operation content of article moving device 40 and information regarding target article AR0 (for example, feeder 20). Display device 7DP can selectively display, for example, moving state 81$a$ of article moving device 40, carrying-out state 81$b$ in which article moving device 40 carries article AR0 (for example, feeder 20) out by using holding section 41, and carrying-in state 81$c$ in which article AR0 is carried in. Display device 7DP can selectively display first target 81$d$, second target 81$e$, third target 81$f$, and fourth target 81$g$. First target 81$d$ represents an operation with respect to article AR0 used in the production plan at present time (time T1 shown in FIG. 9). Second target 81$e$ represents an operation with respect to article AR0 used in the next production plan. Third target 81$f$ represents an operation with respect to article AR0 used in the next after the next production plan. Fourth target 81$g$ represents an operation with respect to article AR0 used in the subsequent production plan.

In addition, display device 7DP can selectively display first application 81$h$ indicating article AR0 used for the changeover, second application 81$i$ indicating article AR0 needed due to the shortage, third application 81$j$ indicating article AR0 needed after the shortage, and fourth application 81$k$ indicating article AR0 for which the notice of the shortage is given.

Use state information DB5 of holding section 41 includes information regarding the use state of holding section 41 at time T1 (refer to FIG. 9) indicated by timeline bar TB0. In the present embodiment, each of two holding sections 41 shown in FIG. 4 can hold two feeders 20 and carry two feeders 20 into the slot or out of the slot in article moving device 40. Feeder 20 held by holding section 41 is identified by identification numbers 1 to 4. Display device 7DP can display, for example, the identification number of feeder 20 held by holding section 41 and the target slot (first slot 121 or second slot 122).

The display of the identification number indicates a carrying-in state in which holding section 41 holds feeder 20 and carries feeder 20 into the slot or a carrying-out state in which feeder 20 is carried out of the slot (during use of holding section 41). The non-display of the identification number indicates a state in which holding section 41 does not hold feeder 20 (holding section 41 is not used). In the present embodiment, article moving device 40 includes holding section 41 that holds article AR0 and carries article AR0 in and out of board work machine WM. In this form, display section 53 can display the carrying-in state and the carrying-out state of article AR0 by holding section 41. As a result, the user of simulation device 50 can recognize the use state of holding section 41.

Setting information DB6 includes various setting information relating to the simulation. Display device 7DP is configured by a touch panel, and display device 7DP also serves as an input device that receives various manipulations by the user. When the user of simulation device 50 manipulates manipulation section 82a, it is possible to select a simulation setting file. When the user of simulation device 50 manipulates manipulation section 82b, it is possible to set the reproduction speed of the simulation (speed of the time elapse of the timeline). When the user of simulation device 50 manipulates manipulation section 82c, the reproduction speed of the simulation is set to be decreased (for example, ½ times). When the user of simulation device 50 manipulates manipulation section 82d, the reproduction of the simulation is temporarily stopped. When the user of simulation device 50 manipulates manipulation section 82e, the reproduction speed of the simulation is set to be increased (for example, doubled).

When the user of simulation device 50 manipulates manipulation section 82f, a file in which the results of simulation are recorded is displayed. When the user of simulation device 50 manipulates manipulation section 82g, the display (simplified display or display shown in FIG. 8) of board production line 1 displayed in third display region DA3 shown in FIG. 8 is changed. When the user of simulation device 50 manipulates manipulation section 82h, the display or non-display of setting information DB6 is changed.

2. Others

As shown in FIG. 1, in the present embodiment, storage device 5 is provided in board production line 1, and article moving device 40 can travel along a traveling path formed by first rail 31 and second rail 32 of exchange system 30. However, storage device 5 and article moving device 40 are not limited to the forms described above, and can take various forms. For example, storage device 5 can be provided at a position separated from board production line 1, and can supply article AR0 to multiple board production lines 1 and collect article AR0 from multiple board production lines 1.

In addition, for example, article moving device 40 can use an unmanned conveyance vehicle. The unmanned conveyance vehicle is an automatic guided vehicle (AGV) that can perform self-traveling without requiring a driving manipulation by the worker. The unmanned conveyance vehicle, which is article moving device 40, can travel, for example, between the storage device provided at a position separated from board production line 1 and board work machine WM (for example, component mounter 10). It should be noted that in the unmanned conveyance vehicle, multiple traveling routes may be assumed.

In addition, in a case in which multiple unmanned conveyance vehicles travel, the priority may be set in multiple unmanned conveyance vehicles. For example, the priority of the unmanned conveyance vehicle that conveys article AR0 due to the occurrence of the shortage of article AR0 is set higher than the priority of the unmanned conveyance vehicle that conveys article AR0 for the changeover. In addition, in a case in which the storage device supplies article AR0 to multiple board production lines 1, the priority of the unmanned conveyance vehicle may be set depending on the production priority in board production line 1 which is a conveyance destination. Further, the priority of the unmanned conveyance vehicle that supplies article AR0 is set higher than the priority of the unmanned conveyance vehicle that collects article AR0. As described above, in a case in which article moving device 40 is the unmanned conveyance vehicle, simulation section 51 can simulate the operating status of board work machine WM and the operating status of article moving device 40, including the traveling route and the priority of the unmanned conveyance vehicle, the operating statuses of other unmanned conveyance vehicles, the operating statuses of other board production lines 1, and the like.

3. Simulation Method

It is also possible to similarly apply the above description of simulation device 50 to the simulation method. Specifically, the simulation method includes a simulation step and an output step. The simulation step corresponds to the control performed by simulation section 51. The output step corresponds to the control performed by output section 52. The simulation method can further include a display step. The display step corresponds to the control performed by display section 53.

4. Example of Effects of Embodiments

Simulation device 50 includes simulation section 51 and output section 52. Accordingly, simulation device 50 can output the temporal change of the operating status of board work machine WM and the temporal change of the operating status of article moving device 40. It is also possible to similarly apply the above description of simulation device 50 to the simulation method.

REFERENCE SIGNS LIST

1: board production line, 121: first slot, 122: second slot, 40: article moving device, 41: holding section, 5: storage device, 50: simulation device, 51: simulation section, 52: output section, 53: display section, 7DP: display device, 90: board, AR0: article, TD1: first operating time zone, TN1: first stop time zone, TD2: second operating time zone, TN2: second stop time zone, TP0: production time zone, TP1: recovery production time zone, TS1: first supply time zone, TS2: second supply time zone, TS3: collection time zone, WM: board work machine, WM0: recovery production machine

The invention claimed is:
1. A simulation device comprising:
a simulation section configured to simulate an operating status of a board work machine configured to perform predetermined board work on a board and produce a board product, and an operating status of an article moving device configured to supply an article needed for production of the board product to the board work machine based on a production plan of the board product; and an output section configured to output time series information indicating a temporal change of the operating status of the board work machine and a temporal change of the operating status of the article moving device, which are results of simulation by the simulation section.

2. The simulation device according to claim 1, further comprising:

a display section configured to, based on the time series information output by the output section, display a first operating time zone in which the board work machine is operated and a first stop time zone in which the board work machine is stopped, and a second operating time zone in which the article moving device is operated and a second stop time zone in which the article moving device is stopped on a display device in a timeline in a comparative manner.

3. The simulation device according to claim 2, wherein the display section is configured to display a production time zone from a start of production to a termination of production of the board product in a timeline for each production plan.

4. The simulation device according to claim 2, wherein the display section is configured to display a recovery production time zone, in the first operating time zone, in which a scheduled production plan is changed due to a shortage of the article in the board work machine and the board work machine performs the board work based on the changed production plan to be distinguishable from other operating time zones of the board work machine.

5. The simulation device according to claim 2, wherein the display section is configured to display a first supply time zone, in the second operating time zone, in which the article moving device is operated to supply the article, which is needed due to a shortage of the article or a changeover in the board work machine, to be distinguishable from other operating time zones of the article moving device.

6. The simulation device according to claim 2, wherein the display section is configured to display a second supply time zone, in the second operating time zone, in which the article moving device is operated to preliminarily supply the article to the board work machine to be distinguishable from other operating time zones of the article moving device.

7. The simulation device according to claim 2, wherein the display section is configured to display a collection time zone, in the second operating time zone, in which the article moving device is operated to collect the article, which is no longer needed in the board work machine, to be distinguishable from other operating time zones of the article moving device.

8. The simulation device according to claim 2, wherein the display section is configured to display a board production line in which the board work machine and the article moving device are provided in a virtual space by a simulation, and sterically display the temporal change of the operating status of the board work machine and the temporal change of the operating status of the article moving device depending on a time elapse of a timeline.

9. The simulation device according to claim 8, wherein the display section is configured to sterically display a supply operation of conveying and supplying the article stored in a storage device to the board work machine to which the article is to be supplied by the article moving device, and a collection operation of conveying and collecting the article, which is no longer needed in the board work machine, to the storage device by the article moving device.

10. The simulation device according to claim 8, wherein the board work machine includes a first slot configured to hold the article used for production of the board product in an exchangeable manner, and a second slot configured to preliminarily hold the article or temporarily hold the article to be collected, the article moving device is configured to perform an exchange operation of the article between the first slot and the second slot, and the display section is configured to sterically display an occupation region of the article in the first slot and an occupation region of the article in the second slot.

11. The simulation device according to claim 8, wherein the article moving device includes a holding section configured to hold the article and carry the article in and out the board work machine, and the display section is configured to display a carrying-in state and a carrying-out state of the article by the holding section.

12. The simulation device according to claim 8, wherein the display section is configured to display a recovery production machine, which is the board work machine that performs the board work, after a scheduled production plan is changed due to a shortage of the article in the board work machine, based on the changed production plan, the board work machine that performs the board work based on the scheduled production plan, and the board work machine that is stopped without performing the board work to be distinguishable from each other.

13. A simulation method comprising:

a simulation step of simulating an operating status of a board work machine configured to perform predetermined board work on a board and produce a board product, and an operating status of an article moving device configured to supply an article needed for production of the board product to the board work machine based on a production plan of the board product; and an output step of outputting time series information indicating a temporal change of the operating status of the board work machine and a temporal change of the operating status of the article moving device, which are results of simulation in the simulation step.

* * * * *